(12) United States Patent
Lee

(10) Patent No.: US 10,530,165 B2
(45) Date of Patent: Jan. 7, 2020

(54) BATTERY MANAGEMENT METHOD, APPARATUS, AND SYSTEM

(71) Applicant: SAMSUNG ELECTRONICS CO., LTD., Suwon-si (KR)

(72) Inventor: Sun-Jae Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 138 days.

(21) Appl. No.: 15/598,748

(22) Filed: May 18, 2017

(65) Prior Publication Data

US 2018/0097375 A1    Apr. 5, 2018

(30) Foreign Application Priority Data

Oct. 5, 2016 (KR) .................. 10-2016-0128253

(51) Int. Cl.
| | |
|---|---|
| H02J 7/00 | (2006.01) |
| G01R 31/36 | (2019.01) |
| H01M 10/42 | (2006.01) |
| G01R 31/396 | (2019.01) |
| B60L 58/22 | (2019.01) |
| G01R 22/06 | (2006.01) |
| H01M 10/48 | (2006.01) |

(52) U.S. Cl.
CPC .......... *H02J 7/0021* (2013.01); *B60L 58/22* (2019.02); *G01R 22/063* (2013.01); *G01R 31/3648* (2013.01); *G01R 31/396* (2019.01); *H01M 10/425* (2013.01); *H02J 7/0047* (2013.01); *B60L 2240/547* (2013.01); *B60L 2240/549* (2013.01); *H01M 10/482* (2013.01); *H01M 2010/4271* (2013.01); *Y02T 10/7005* (2013.01); *Y02T 10/7055* (2013.01); *Y02T 10/7061* (2013.01)

(58) Field of Classification Search
CPC .............................. H02J 7/0021; H02J 7/0047
USPC ........................................................ 320/128
See application file for complete search history.

(56) References Cited

U.S. PATENT DOCUMENTS

| 8,525,519 B2 | 9/2013 | Johnson et al. |
|---|---|---|
| 8,972,091 B2 | 3/2015 | Li et al. |
| (Continued) | | |

FOREIGN PATENT DOCUMENTS

| JP | 4283615 B2 | 6/2009 |
|---|---|---|
| JP | 2005-062028 A | 11/2012 |
| (Continued) | | |

OTHER PUBLICATIONS

Extended European Search Report dated Nov. 10, 2017 in corresponding European Patent Application No. 17187181.7 (9 pages in English).

*Primary Examiner* — Suchin Parihar
(74) *Attorney, Agent, or Firm* — NSIP Law

(57) ABSTRACT

Disclosed is a battery management method and corresponding apparatus to manage a battery including determining state information of a target battery, among batteries, based on quantity data of the target battery. The method and apparatus also includes determining state information of a battery, different from the target battery, among the batteries, based on the state information of the target battery and difference information between electrical quantity data of the different battery and the electrical quantity data of the target battery.

31 Claims, 12 Drawing Sheets

(56) References Cited

U.S. PATENT DOCUMENTS

| | | | |
|---|---|---|---|
| 2008/0007218 A1* | 1/2008 | Veselic | H02J 7/0022 320/116 |
| 2009/0066291 A1 | 3/2009 | Tien et al. | |
| 2009/0189613 A1 | 7/2009 | Plett | |
| 2011/0025290 A1* | 2/2011 | Chen | H02M 3/155 323/311 |
| 2011/0080138 A1* | 4/2011 | Nakanishi | H02J 7/0016 320/116 |
| 2014/0062494 A1 | 3/2014 | Lin et al. | |
| 2015/0054467 A1* | 2/2015 | Takano | H01M 10/48 320/136 |
| 2015/0321576 A1 | 11/2015 | Lee | |
| 2017/0365893 A1* | 12/2017 | Kim | H01M 10/633 |

FOREIGN PATENT DOCUMENTS

| | | |
|---|---|---|
| JP | 5319134 B2 | 10/2013 |
| JP | 2015-38437 A | 2/2015 |
| KR | 10-2014-0073627 A | 6/2014 |
| WO | WO 2012/157747 A1 | 1/2016 |
| WO | WO 2016/083757 A1 | 6/2016 |

\* cited by examiner

BATTERY MANAGEMENT METHOD, APPARATUS, AND SYSTEM

CROSS-REFERENCE TO RELATED APPLICATION(S)

This application claims the benefit under 35 USC § 119(a) of Korean Patent Application No. 10-2016-0128253 filed on Oct. 5, 2016, in the Korean Intellectual Property Office, the entire disclosure of which is incorporated herein by reference for all purposes.

BACKGROUND

1. Field

The following description relates to battery management method, apparatus, and system.

2. Description of Related Art

A state of a battery affects charging and discharging of the battery unit. Thus, a management of the battery may include an estimation of the state of the battery unit. The state of the battery is estimated by applying a current, a voltage, and a temperature of the battery to a state estimation algorithm.

When the number of battery units is relatively small, the state of the battery may be quickly estimated by executing the state estimation algorithm in a legacy processing device, for example, a low-performance/low-price processing device. However, as a number of battery units increases, a number of factors affecting the state of each battery also increases. In such case, the state estimation algorithm may be more complicated as being time consuming and complex to perform and; thus, it becomes difficult to quickly estimate the state of the battery using the legacy processing device.

When executing a complex state estimation algorithm in a high-performance processing device, the state of the battery may be much quickly estimated. However, in general, high costs and a complex operating system, for example, Linux may be required for the high-performance processing device. In such case, a production cost of a battery management apparatus increases and the operating system may need to be managed for the battery management apparatus.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a method to manage a battery, including: determining state information of a target battery, among batteries, based on quantity data of the target battery; and determining state information of a battery, different from the target battery, among the batteries, based on the state information of the target battery and difference information between electrical quantity data of the different battery and the electrical quantity data of the target battery.

The method may further include: calculating change information of each of the batteries based on a value of a difference between electrical quantity data of each of the batteries and approximate data corresponding to the electrical quantity data of each of the batteries; and determining the target battery among the batteries based on the change information.

The target battery may also include any one or any combination of any two or more of a battery corresponding to maximal change information, a battery corresponding to average change information, or a battery corresponding to minimal change information.

The calculating of the change information of each of the batteries may also include: calculating difference values between items of electrical quantity data in a reference interval of each of the batteries and approximate data of the items of electrical quantity data; and obtaining a sum of the calculated difference values for each of the batteries.

The method may further include calculating, in response to target batteries being determined, difference information between electrical quantity data of each of the target batteries and the electrical quantity data of the different battery; and identifying a corresponding target battery of the different battery among the target batteries based on the calculated difference information, wherein the determining of the state information of the different battery may also include: determining the state information of the different battery based on the difference information between electrical quantity data of the corresponding target battery and the electrical quantity data of the different battery.

The corresponding target battery may be a target battery including electrical quantity data most similar to the electrical quantity data of the different battery.

The method may further include selecting, in response to target batteries being determined, a target battery corresponding to a minimal value of difference information between electrical quantity data of each of the target batteries and the electrical quantity data of the different battery, wherein the determining of the state information of the different battery may also include: determining a value, obtained by multiplying the minimal value by state information of the selected target battery, to be the state information of the different battery.

The method may further include calculating difference values between items of electrical quantity data in a reference interval of the different battery and items of electrical quantity data in the reference interval of the target battery and determining a sum of the calculated values to be the state information of the different battery.

The method may further include identifying a battery excluding the target battery during a period of time among the batteries; and determining state information of the identified battery based on quantity data of the identified battery.

The determining of the state information of the identified battery may also include: re-determining the state information of the identified battery based on the quantity data of the identified battery in response to the state information of the identified battery being determined based on difference information between electrical quantity data of a corresponding target battery of the identified battery and electrical quantity data of the identified battery and state information of the corresponding target battery, and wherein the corresponding target battery may be a target battery corresponding to electrical quantity data most similar to the electrical quantity data of the identified battery.

In accordance with another embodiment, there is provided a method to manage a battery, including: determining state information of each of target batteries among batteries based on quantity data of each of the target batteries; calculating difference information between electrical quantity data of each of the target batteries and electrical quantity data of a battery, different from the target batteries, among the batteries; selecting a target battery from the target batteries based on the difference information; and determining state information of the different battery based on state information of the selected target battery and difference information between the electrical quantity data of the different battery and electrical quantity data of the selected target battery.

The method may further include calculating change information of each of the batteries based on a difference between the electrical quantity data of each of the target batteries and approximate data corresponding to the electrical quantity data of each of the batteries; and determining the target batteries based on the change information.

The calculating of the difference information may also include calculating difference values between items of electrical quantity data in a reference interval of the different battery and a items of electrical quantity data in the reference interval of each of the target battery and determining a sum of the calculated values to be the difference information.

The selecting of the target battery may also include selecting a target battery for which minimal difference information may be calculated, and the determining of the state information of the different battery may also include determining a value obtained by multiplying the minimal difference information and the state information of the selected target battery to be the state information of the different battery.

In accordance with an embodiment, there may be provided a non-transitory computer-readable storage medium storing instructions that, when executed by a processor, cause the processor to perform the method described above.

In accordance with an embodiment, there may be provided an apparatus to manage a battery, including: a communicator configured to receive quantity data of each of a plurality of batteries; and a controller configured to determine state information of a target battery determined among the batteries based on physical quantity data of the target battery and determine state information of a battery, different from the target battery among the batteries, based on the state information of the target battery and difference information between electrical quantity data of the different battery and electrical quantity data of the target battery.

The controller may be configured to calculate change information of each of the batteries based on a value of a difference between electrical quantity data of each of the batteries and approximate data corresponding to the electrical quantity data of each of the batteries, and determine the target battery among the batteries based on the change information.

The target battery may also include any one or any combination of any two or more of a battery corresponding to maximal change information, a battery corresponding to average change information, or a battery corresponding to minimal change information.

The controller may be configured to calculate difference values between items of electrical quantity data in a reference interval of each of the batteries and approximate data of the items of electrical quantity data, and obtain a sum of the calculated difference values for each battery.

In response to target batteries being determined, the controller may be configured to calculate difference information between electrical quantity data of each of the target batteries and the electrical quantity data of the different battery, identify a corresponding target battery of the different battery among the target batteries based on the calculated difference information, and determine the state information of the different battery based on the difference information between electrical quantity data of the corresponding target battery and the electrical physical quantity data of the different battery.

The corresponding target battery may be a target battery corresponding to electrical quantity data most similar to the electrical quantity data of the different battery.

In response to target batteries being determined, the controller may be configured to select a target battery corresponding to a minimal value of difference information between electrical quantity data of each of the target batteries and the electrical quantity data of the different battery, and determine a value, obtained by multiplying the minimal value by state information of the selected target battery, to be the state information of the different battery.

The controller may be configured to calculate difference values between items of electrical quantity data in a reference interval of the different battery and items of electrical quantity data in the reference interval of the target battery, and determine a sum of the calculated values to be the difference information.

The controller may be configured to identify a battery excluding the target battery during a period of time among the batteries, and determine state information of the identified battery based on physical quantity data of the identified battery.

The controller may be configured to re-determine the state information of the identified battery based on the quantity data of the identified battery in response to the state information of the identified battery being determined based on difference information between electrical quantity data of a corresponding target battery of the identified battery and electrical quantity data of the identified battery and state information of the corresponding target battery, wherein the corresponding target battery may be a target battery corresponding to electrical physical quantity data most similar to the electrical quantity data of the identified battery.

In accordance with an embodiment, there is provided a battery management system, including: a slave battery management apparatus corresponding to a battery module including battery cells; and a master battery management apparatus configured to communicate with the slave battery management apparatus, wherein the battery management system may be configured to receive physical quantity data of each of the battery cells, determine state information of a target battery cell determined among the battery cells based on physical quantity data of the determined target cell, and determine state information of a battery cell different from the target battery cell, among the battery cells, based on the state information of the target battery cell and difference information between electrical quantity data of the different target cell and electrical quantity data of the target battery cell.

In response to a plurality of target battery cells being determined, the battery management system may be configured to calculate difference information between electrical quantity data of each of the target battery cells and the electrical quantity data of the different battery cell, identify a corresponding target battery cell of the different battery cell based on the calculated difference information, and determine the state information of the different battery cell based on state information of the corresponding target battery cell and difference information between electrical physical quantity data of the corresponding target battery cell and the electrical physical quantity data of the different battery cell.

Other features and aspects will be apparent from the following detailed description, the drawings, and the claims.

Figure 1:
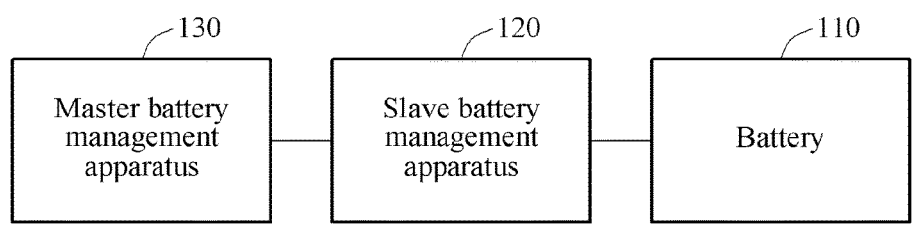
FIG. 1 illustrates an example of a battery system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. The sequences of operations described herein are merely examples, and are not limited to those set forth herein, but may be changed as will be apparent after an understanding of the disclosure of this application, with the exception of operations necessarily occurring in a certain order. Also, descriptions of functions and constructions that are well known in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, reference will now be made in detail to examples with reference to the accompanying drawings, wherein like reference numerals refer to like elements throughout.

Various alterations and modifications may be made to the examples. Here, the examples are not construed as limited to the disclosure and should be understood to include all changes, equivalents, and replacements within the idea and the technical scope of the disclosure.

The terminology used herein is for the purpose of describing particular examples only, and is not to be used to limit the disclosure. As used herein, the terms "a," "an," and "the" are intended to include the plural forms as well, unless the context clearly indicates otherwise. As used herein, the terms "include, "comprise," and "have" specify the presence of stated features, numbers, operations, elements, components, and/or combinations thereof, but do not preclude the presence or addition of one or more other features, numbers, operations, elements, components, and/or combinations thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

When describing the examples with reference to the accompanying drawings, like reference numerals refer to like constituent elements and a repeated description related thereto will be omitted. When it is determined detailed description related to a related known function or configuration they may make the purpose of the examples unnecessarily ambiguous in describing the examples, the detailed description will be omitted here.

FIG. 1 illustrates an example of a battery system.

Referring to FIG. 1A, a battery system includes a battery 110, a slave battery management apparatus 120, and a master battery management apparatus 130. In an example of FIG. 1, the battery system includes a single battery and a single slave battery management apparatus. However, a number of batteries and a number of slave battery management apparatuses are not limited to the example. Thus, the battery system may also include a plurality of batteries and/or a plurality of slave battery management apparatuses.

The battery 110 is, for example, a battery cell, a battery module or a battery pack. When the battery 110 is a battery module, the battery module 110 includes at least one battery cell. When the battery 110 is a battery pack, the battery 110 includes at least one battery module or at least one battery cell.

The slave battery management apparatus is electrically connected to the battery 110 and collects physical quantity data of the battery 110. The physical quantity data includes, for example, any one or any combination of any two or more of voltage data, current data, temperature data, and impedance data of a battery.

The master battery management apparatus 130 communicates with the slave battery management apparatus 120. For example, the master battery management apparatus 130 communicates with the slave battery management apparatus 120 through a controller area network (CAN) communication. The master battery management apparatus 130 receives the physical quantity data of the battery 110 from the slave battery management apparatus 120.

The master battery management apparatus 130 determines state information of the battery 110. The state information include information on, for example, a state of charge (SOC), a state of health (SOH), and/or a remaining capacity of the battery 110. In an embodiment, the remaining capacity indicates, for example, an amount of charge remaining in the battery 110. Also, the state information is, for example, a value obtained by multiplying the SOC by the SOH. Hereinafter, a battery management system will be described with reference to FIG. 2.

Figure 2:
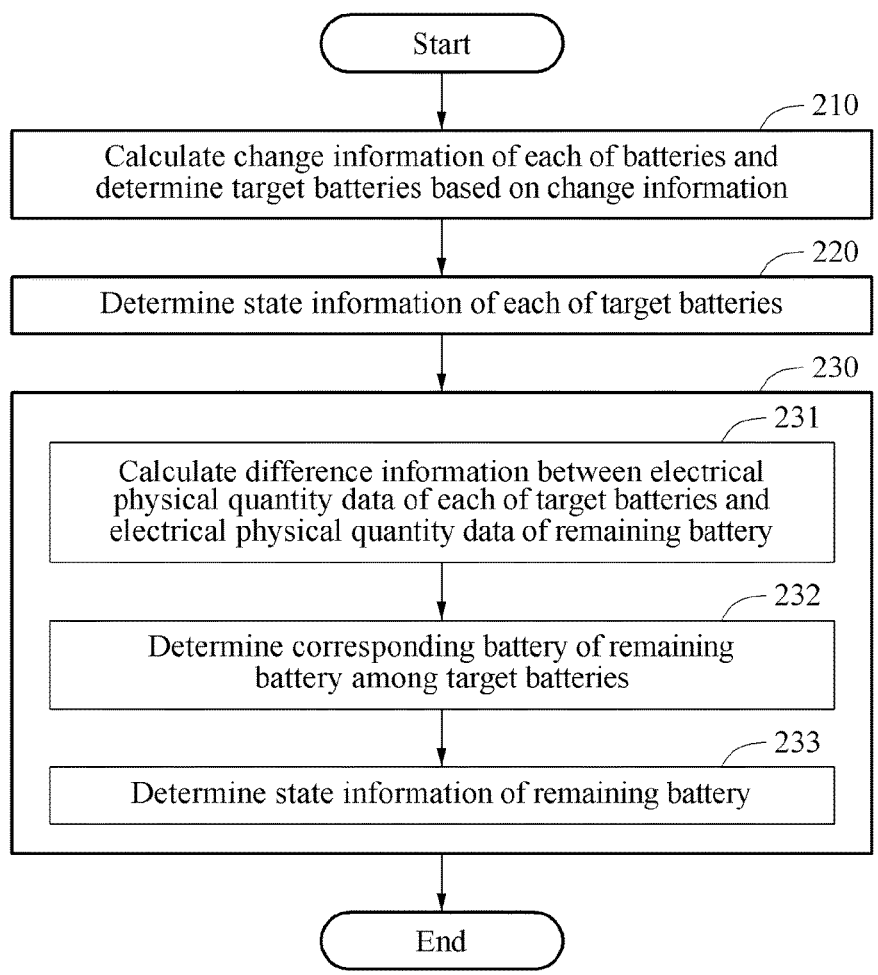
FIG. 2 illustrates an example of an operation method of a battery management system.

FIG. 2 illustrates an example of an operation method of a battery management system.

A battery management system includes a master battery management apparatus and a slave battery management apparatus. An example of FIG. 2 may be implemented at the master battery management apparatus and also be implemented at the slave battery management apparatus. The following description will be provided based on an example implemented at the master battery management apparatus, as an example.

The master battery management apparatus receives physical quantity data of each of a plurality of batteries from the slave battery management apparatus. A battery indicates, for example, a battery cell or a battery module. The physical quantity data includes electrical physical quantity data, such as voltage data and/or current data, and thermal physical quantity data, such as temperature data.

The master battery management apparatus sets a voltage interval and identifies a time interval corresponding to the voltage interval. For example, as shown in Table 1, electrical physical quantity data of each of the batteries in a voltage interval of voltages $v_0$ though $v_n$ is present or absent at points in time. Here, the voltage $v_0$ is lower than the voltage $v_n$. Depending on examples, the voltage $v_0$ can be higher than the voltage $v_n$. In an embodiment, a point in time and points in time is also be referred to as a time point and time points, respectively.

In Table 1, an ○ mark indicates that electrical physical quantity data in a voltage interval is present at a time point, and an X mark indicates that the electrical physical quantity data in the voltage interval is absent at the time point.

TABLE 1

| Battery_ID | 1 | ... | $t_x$ | $t_0$ | $t_1$ | $t_2$ | ... | $t_n$ | $t_{n+1}$ | $t_{n+2}$ |
|---|---|---|---|---|---|---|---|---|---|---|
| 1 | X | ... | X | ○ | ○ | ○ | ... | ○ | X | X |
| 2 | X |   | ○ | ○ | ○ | ○ |   | ○ | ○ | X |
| 3 | X |   | ○ | ○ | ○ | ○ |   | ○ | ○ | ○ |
| 4 | X |   | ○ | ○ | ○ | ○ |   | ○ | ○ | ○ |
| 5 | ○ |   | ○ | ○ | ○ | ○ |   | ○ | ○ | ○ |
| 6 | ○ |   | ○ | ○ | ○ | ○ |   | ○ | ○ | ○ |
| 7 | ○ |   | ○ | ○ | ○ | ○ |   | ○ | ○ | ○ |
| 8 | ○ |   | ○ | ○ | ○ | ○ |   | ○ | ○ | ○ |

At a time point 1, electrical physical quantity data of battery_1 through battery_4 is absent in the voltage interval. For example, at the time point 1, the electrical physical quantity data of each of battery_1 through battery_4 is less than the voltage $v_0$. In this example, the electrical physical quantity data of each of battery_1 through battery_4 is absent in the voltage interval. Electrical physical quantity data of at least one of the batteries changes over time and, at a time point $t_0$, electrical physical quantity data of each of the batteries is present in the voltage interval.

The master battery management apparatus identifies a time point or a point in time at which the electrical physical quantity data of the batteries is fully present. The master battery management apparatus sets a time interval based on the identified time point. In Table 1, the master battery management apparatus sets a time interval between the time points $t_0$ and $t_n$, including time points $t_0$ through $t_n$. As a result, a reference interval corresponding to voltages $v_0$ through $v_n$ and time points $t_0$ through $t_n$ is set. When the number of items of electrical physical quantity data corresponding to the same time index is the same as the number of batteries, the master battery management apparatus sets a time interval based on the time index. In this example, the electrical physical quantity data corresponding to the same time index is present in a voltage interval. In Table 1, the number of items of voltage data corresponding to the time index $t_0$ is 8 that is the same as the number of battery.

Similarly, the number of items of voltage data corresponding to the time index $t_n$ is 8, which is the same as the number of battery. The master battery management apparatus sets the time interval between the time points $t_0$ and $t_n$. Through this, the reference interval corresponding to the voltages $v_0$ through $v_n$ and the time points $t_0$ and $t_n$ is set.

In operation 210, the master battery management apparatus calculates change information of each of the batteries, and determines a plurality of target batteries based on the change information. The change information is calculated based on a difference between electrical physical quantity data, for example, a voltage value of a battery and approximate data, for example, an approximate value corresponding to the electrical physical quantity data. In one example, the master battery management apparatus calculates difference values between a plurality of items of electrical physical quantity data, for example, items of time-series voltage data in a reference interval of a battery and approximate data corresponding to the plurality of items of electrical physical quantity data. The master battery management apparatus obtains a sum of the difference values. The master battery management apparatus determines the sum of the difference value to be change information of the battery. The master battery management apparatus calculates change information of another battery through an operation similar to the foregoing operation of calculating the change information of the battery. Hereinafter, a calculation of the change information will be described with reference to FIG. 3.

Figure 3:
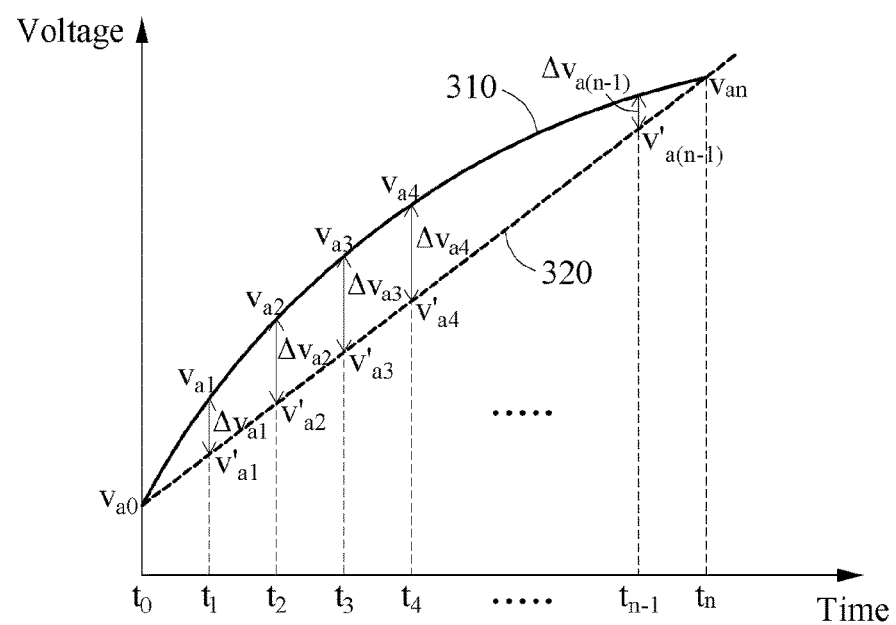
FIG. 3 illustrates an example of calculating change information.

FIG. 3 illustrates an example of calculating change information.

FIG. 3 illustrates voltage data 310. The voltage data 310 is voltage data of a reference interval corresponding to voltages $v_0$ through $v_n$ and time points to through $t_n$. Also, the voltage data 310 is voltage data of battery_1. In an example of FIG. 3, battery_1 is charged. Hereinafter, a calculation of change information of battery_1 will be described. However, the present examples are not to be taken as being limited thereto. The following description is also applicable to battery_1 in a discharging state.

The master battery management apparatus determines approximate data 320 corresponding to the voltage data 310. As illustrated in FIG. 3, the master battery management apparatus performs a linear approximation between voltage data $\{v_{a0} \ldots v_{an}\}$ based on voltage data $v_{a0}$ corresponding to the time point $t_0$ and voltage data $v_{an}$ corresponding to the time point $t_n$ to determine approximate data $\{v_{a0}, v'_{a1}, \ldots, v'_{a(n-1)}, v_{an}\}$.

When the approximate data 320 is determined, the master battery management apparatus calculates a difference value between the voltage data 310 and the approximate data 320. For example, the master battery management apparatus calculates a difference as below.

$$\Delta v_{a1} = v_{a1} - v'_{a1}$$

$$\Delta v_{a2} = v_{a2} - v'_{a2}$$

$$\Delta v_{a3} = v_{a3} - v'_{a3}$$

$$\Delta v_{a4} = v_{a4} - v'_{a4}$$

$$\Delta v_{a(n-1)} = v_{a(n-1)} - v'_{a(n-1)}$$

The master battery management apparatus calculates a difference value between voltage data corresponding to a time point or a time index in the reference interval and approximate data corresponding to the voltage data. As described above, difference values corresponding to time points in the reference interval is calculated.

The master battery management apparatus obtains a sum of the difference values and determines the sum to be change information. In the foregoing example, the master battery management apparatus obtains a sum of difference values $\Delta v_{a1}$ through $\Delta v_{a(n-1)}$. When the sum of difference values $\Delta v_{a1}$ through $\Delta v_{a(n-1)}$ is change information $var_1$, the master battery management apparatus determines $var_1$ to be change information of battery_1.

The master battery management apparatus calculates the change information of battery_1 based on the difference value between the voltage data 310 and the approximate data 320. The master battery management apparatus calculates change information of another battery in the reference interval corresponding to the voltages $v_0$ through $v_n$ and the time points $t_0$ through to based on voltage data of the other battery and approximate data corresponding to the voltage data of the other battery.

For example, change information of each of a batteries is calculated as shown in Table 2.

TABLE 2

| Battery_ID | Change information |
| --- | --- |
| 1 | $var_1$ |
| 2 | $var_2$ (maximal) |
| 3 | $var_3$ |
| 4 | $var_4$ (average) |
| 5 | $var_5$ |
| 6 | $var_6$ (minimal) |
| 7 | $var_7$ |
| 8 | $var_8$ |

The master battery management apparatus calculates an area between a graph of the voltage data 310 and a graph of the approximate data 320. For example, the master battery management apparatus calculates the area by subtracting an integral value of the graph of the approximate data 320 from an integral value of the graph of the voltage data 310. The master battery management apparatus determines the calculated area to be the change information of battery_1.

Referring back to FIG. 2, when the change information of each of the batteries is calculated, the master battery management apparatus calculates average change information. The average change information is a value obtained by dividing a sum of the change information of the batteries by the number of batteries. The master battery management apparatus determines a battery corresponding to the average change information to be a target battery. When the battery corresponding to the average change information is absent, the master battery management apparatus determines a battery corresponding to the most approximate value of the average change information to be the target battery.

Also, the master battery management apparatus verifies maximal change information and minimal change information from the average change information. The master battery management apparatus determines a battery corresponding to the maximal change information and a battery corresponding to the minimal change information to be target batteries. As a result, the target batteries are determined. In Table 2, when change information $var_2$ is maximal, change information $var_4$ is average or the most approximate to the average, and change information $var_6$ is minimal, battery_2, battery_4, and battery unit_6 are determined to be target batteries.

The foregoing explanation of determining the target battery is merely an example and thus, the present example is not to be taken as being limited thereto. Also, one of the batteries corresponding to the maximal change information, the average change information, and the minimal change information is determined to be a target battery. In Table 2, one of battery_2, battery_4, and battery_6 is determined to be a target battery. A combination of two or more batteries corresponding to the maximal change information, the average change information, and the minimal change information is determined to be a target battery. In Table 2, for instance, two of battery_2, battery_4, and battery_6 are determined to be target batteries.

Hereinafter, a case in which target batteries are determined will be described.

In operation 220, in response to the target batteries being determined, the master battery management apparatus determines state information of each of the target batteries. For example, the master battery management apparatus determines the state information of each of the target batteries based on physical quantity data of each of the target batteries. The state information includes information about, for example, an SOC, an SOH, and/or a remaining capacity. Also, the state information is a value obtained by multiplying the SOC by the SOH.

In operation 230, the master battery management apparatus determines state information of a remaining battery other than the target batteries among the batteries. The remaining battery is, for example, one or more remaining batteries.

To determine the state information of the remaining battery, the master battery management apparatus calculates difference information between electrical physical quantity data of each of the target batteries and electrical physical quantity data of the remaining battery in operation 231. The master battery management apparatus calculates difference values between items of electrical physical quantity data, for example, items of time-series voltage data in the reference interval of the remaining battery and items of electrical physical quantity data, for example, items of time-series voltage data in the reference interval of the target batteries. The master battery management apparatus determines a sum of the difference values to be the difference information. Hereinafter, a calculation of the difference information will be described with reference to FIGS. 4A through 4C.

Figure 4A:
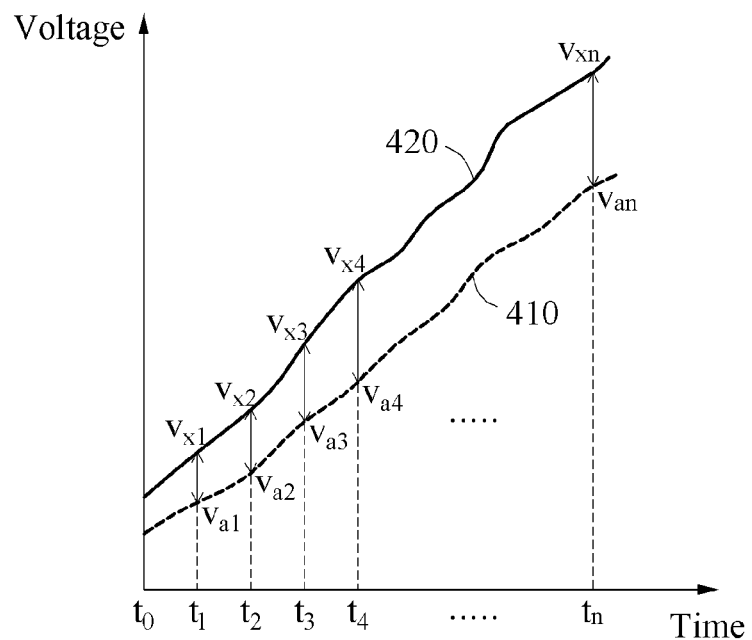
FIGS. 4A through 4C illustrate examples of calculating difference information.
Figure 4B:
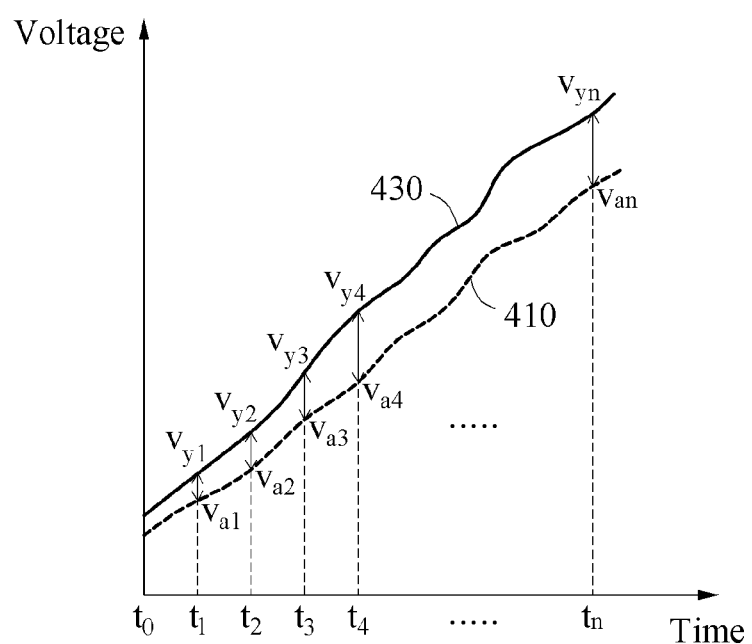
Figure 4C:
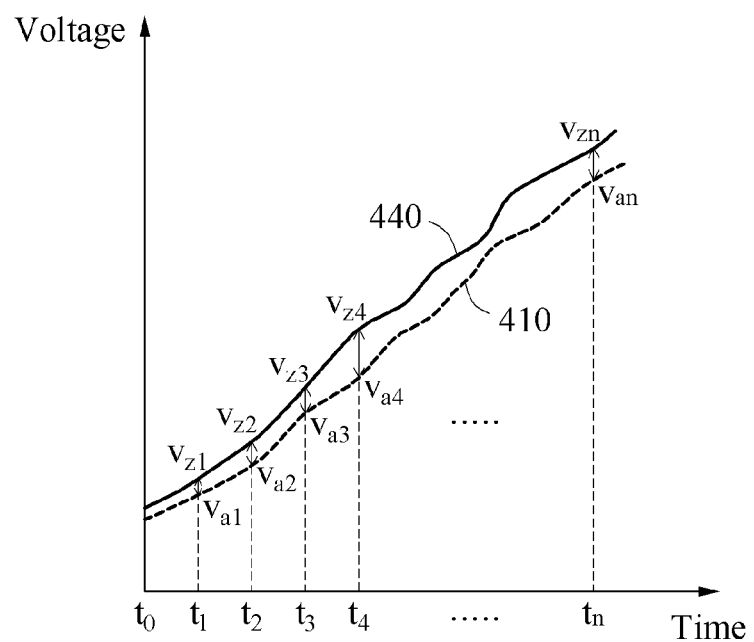

FIGS. 4A through 4C illustrate examples of calculating difference information.

In Table 2, battery_2, battery_4, and battery_6 are target battery units and; thus, battery_1, battery_3, battery_5, battery_7, and battery_8 are remaining battery units.

FIG. 4A illustrates voltage data 410 and voltage data 420 of a first target battery. The voltage data 410 and the voltage data 420 are voltage data distributed in a reference interval corresponding to voltages $v_0$ through $v_n$ and time points $t_0$ through $t_n$.

The voltage data 410 is voltage data of battery_1. The first target battery is a battery corresponding to maximal change information, for example, battery_2 in Table 2.

The master battery management apparatus calculates a difference value between the voltage data 410 of battery_1 and the voltage data 420 of the first target battery. For example, the master battery management apparatus calculates the difference value as follows: $\Delta v_{x\text{-}a\_1}=v_{x1}-v_{a1}$, $\Delta v_{x\text{-}a\_2}=v_{x2}-v_{a2}$, $\Delta v_{x\text{-}a\_3}=v_{x3}-v_{a3}$, $\Delta v_{x\text{-}a\_4}=v_{x4}-v_{a4}$, . . . $\Delta v_{x\text{-}a\_n}=v_{xn}-v_{an}$.

The master battery management apparatus calculates a difference value between the voltage data 410 of battery_1 and the voltage data 420 of the first target battery for each time point or time index in the reference interval and approximate data corresponding to the voltage data. As described above, difference values corresponding to time points in the reference interval are calculated.

The master battery management apparatus obtains a sum of difference values $\Delta v_{x\text{-}a\_1}$ through $\Delta v_{x\text{-}a\_n}$. The master battery management apparatus determines the sum of difference values $\Delta v_{x\text{-}a\_1}$ through $\Delta v_{x\text{-}a\_n}$ to be difference information $\text{diff}_{1\_1}$, between the voltage data 410 of battery_1 and the voltage data 420 of the first target battery.

Although not shown in FIG. 4A, the master battery management apparatus calculates difference information $\text{diff}_{3\_1}$ between voltage data of battery_3 and the voltage data 420 of the first target battery. Similarly, the master battery management apparatus calculates difference information between the voltage data 420 of the first target battery and voltage data of each of battery_5, battery_7, and battery_8. The master battery management apparatus calculates difference information $\text{diff}_{5\_1}$, difference information $\text{diff}_{7\_1}$, and difference information $\text{diff}_{8\_1}$, each corresponding to the difference information between the voltage data 420 of the first target battery and the battery_5, the battery_7, and the battery_8, respectively.

FIG. 4B illustrates the voltage data 410 of battery_1 and voltage data 430 of a second target battery. The second target battery is a battery corresponding to average change information, for example, battery_4 in Table 2.

The master battery management apparatus calculates a difference value between the voltage data 410 of battery_1 and the voltage data 430 of the second target battery. For example, the master battery management apparatus calculates the difference value as follows: $\Delta v_{y\text{-}a\_1}=v_{y1}-v_{a1}$, $\Delta v_{y\text{-}a\_2}=v_{y2}-v_{a2}$, $\Delta v_{y\text{-}a\_3}=v_{y3}-v_{a3}$, $\Delta v_{y\text{-}a\_4}=v_{y4}-v_{a4}$, . . . $\Delta v_{y\text{-}a\_n}=v_{yn}-v_{an}$.

The master battery management apparatus obtains a sum of difference values $\Delta v_{y\text{-}a\_1}$ through $\Delta v_{y\text{-}a\_n}$. The master battery management apparatus determines the sum of difference values $\Delta v_{y\text{-}a\_1}$ through $\Delta v_{y\text{-}a\_n}$ to be difference information $\text{diff}_{1\_2}$ between the voltage data 430 of the second target battery and the voltage data 410 of battery_1.

Although not shown in FIG. 4B, the master battery management apparatus calculates difference information $\text{diff}_{3\_2}$ between the voltage data of battery_3 and the voltage data 430 of the second target battery. Similarly, the master battery management apparatus calculates difference information between the voltage data 430 of the second target battery and the voltage data of each of battery_5, battery_7, and battery_8. The master battery management apparatus calculates difference information $\text{diff}_{5\_2}$, difference information $\text{diff}_{7\_2}$, and difference information $\text{diff}_{8\_2}$, each corresponding to the difference information between the voltage data 430 of the second target battery and the battery_5, the battery_7, and the battery_8, respectively.

FIG. 4C illustrates the voltage data 410 of battery_1 and voltage data 440 of a third target battery. The third target battery is a battery corresponding to minimal change information, for example, battery_6 in Table 2.

The master battery management apparatus calculates a difference value between the voltage data 410 of battery_1 and the voltage data 440 of the third target battery. For example, the master battery management apparatus calculates the difference value as follows: $\Delta v_{z\text{-}a\_1}=v_{z1}-v_{a1}$, $\Delta v_{z\text{-}a\_2}=v_{z2}-v_{a2}$, $\Delta v_{z\text{-}a\_3}=v_{z3}-v_{a3}$, $\Delta v_{z\text{-}a\_4}=v_{z4}-v_{a4}$, . . . $\Delta v_{z\text{-}a\_n}=v_{zn}-v_{an}$.

The master battery management apparatus obtains a sum of difference values $\Delta v_{z\text{-}a\_1}$ through $\Delta v_{z\text{-}a\_n}$. The master battery management apparatus determines the sum of difference values $\Delta v_{z\text{-}a\_1}$ through $\Delta v_{z\text{-}a\_n}$ to be difference information $\text{diff}_{1\_3}$ between the voltage data 440 of the third target battery and the voltage data 410 of battery_1.

Although not shown in FIG. 4C, the master battery management apparatus calculates difference information $\text{diff}_{3\_3}$ between the voltage data of battery_3 and the voltage data 440 of the third target battery. Similarly, the master battery management apparatus calculates difference information between the voltage data 440 of the third target battery and the voltage data of each of battery_5, battery_7, and battery_8. The master battery management apparatus calculates difference information $\text{diff}_{5\_3}$, difference information $\text{diff}_{7\_3}$, and difference information $\text{diff}_{8\_3}$, each corresponding to the difference information between the voltage data 440 of the third target battery and the battery_5, the battery_7, and the battery_8, respectively.

For example, difference information of each of the batteries is calculated as shown in Table 3.

TABLE 3

| Battery_ID | Difference information 1 | Difference information 2 | Difference information 3 |
|---|---|---|---|
| 1 | $\text{diff}_{1\_1}$ | $\text{diff}_{1\_2}$ | $\text{diff}_{1\_3}$ |
| 2 | — | — | — |
| 3 | $\text{diff}_{3\_1}$ | $\text{diff}_{3\_2}$ | $\text{diff}_{3\_3}$ |
| 4 | — | — | — |
| 5 | $\text{diff}_{5\_1}$ | $\text{diff}_{5\_2}$ | $\text{diff}_{5\_3}$ |
| 6 | — | — | — |
| 7 | $\text{diff}_{7\_1}$ | $\text{diff}_{7\_2}$ | $\text{diff}_{7\_3}$ |
| 8 | $\text{diff}_{8\_1}$ | $\text{diff}_{8\_2}$ | $\text{diff}_{8\_3}$ |

Referring back to FIG. 2, in operation 232, the master battery management apparatus determines a corresponding battery of the remaining battery among the target batteries based on the difference information. For example, a target battery corresponding to a minimal value of items of difference information related to the remaining battery is determined to be the corresponding target battery of the remaining battery. Also, a target battery corresponding to the electrical physical quantity data that is most similar to the electrical physical quantity data of the remaining battery is determined to be the corresponding target battery of the remaining battery.

In Table 2, among the difference information $\text{diff}_{1\_1}$, $\text{diff}_{1\_2}$, and $\text{diff}_{1\_3}$ associated with battery_1, the difference information $\text{diff}_{1\_3}$ is minimal. The master battery management apparatus determines the third target battery to be a corresponding battery of battery_1. Similarly, when difference information $\text{diff}_{3\_2}$ is minimal among items of difference information associated with battery_3, the master battery management apparatus determines battery_4, which is a battery associated with the difference information $\text{diff}_{3\_2}$, to be a corresponding target battery of battery_3. The master battery management apparatus determines a corresponding target battery of each of the battery_5, the battery_7, and the battery_8 through a similar operation as described. In this example, battery_2, battery_4, and battery_6 are corresponding target batteries of battery_5, battery_7, and battery_8, respectively.

In operation 233, in response to the corresponding target battery being determined, the master battery management apparatus determines state information of the remaining battery based on state information of the corresponding target battery and difference information between electrical physical quantity data the corresponding target battery and the electrical physical quantity data of the remaining battery.

For example, the master battery management apparatus determines the state information of the remaining battery using Equation 1 as below.

State information of remaining battery=State information of corresponding target battery×Difference information [Equation 1]

In Equation 1, Difference information is a minimal value of the difference information associated with the remaining battery. Also, Difference information in Equation 1 is the difference information between the electrical physical quantity data of the corresponding target battery and the electrical physical quantity data of the remaining battery.

The state information of each of the batteries is determined as shown in Table 4.

TABLE 4

| Battery_ID | State information |
| --- | --- |
| 1 | State information of battery_6 × $diff_{1\_3}$ |
| 2 | State information of battery_2 |
| 3 | State information of battery_4 × $diff_{3\_2}$ |
| 4 | State information of battery_4 |
| 5 | State information of battery_2 × $diff_{5\_1}$ |
| 6 | State information of battery_6 |
| 7 | State information of battery_4 × $diff_{7\_2}$ |
| 8 | State information of battery_6 × $diff_{8\_3}$ |

The master battery management apparatus determines the state information of the remaining battery without having to use the physical quantity data of the remaining battery. As a result, an amount of time and data throughput to determine the state information of each of the batteries are significantly reduced.

A predetermined event occurs. For example, an event occurs in which some of the batteries are not determined to be a target battery during a history monitoring time. A target battery history is managed as shown in Table 5. The following description of the target battery history is in accord with an example. In Table 5, t denotes, but not be limited to, 100 milliseconds (ms).

TABLE 5

| Battery_ID | t | 2t | 3t | 4t | 5t | 6t | 7t |
| --- | --- | --- | --- | --- | --- | --- | --- |
| 1 | | | | | | | |
| 2 | Target | Target | | | Target | | Target |
| 3 | | Target | Target | Target | | Target | |
| 4 | Target | | | Target | | | Target |
| 5 | | Target | | Target | Target | Target | |
| 6 | Target | | Target | | | Target | Target |
| 7 | | | Target | | Target | | |
| 8 | | | | | | | |

In Table 5, when battery unit_2, battery_4, and battery_7 are determined to be the target batteries during a period of time from 6t to 7t, the state information of each of battery_1, battery_5, battery_6, and battery_8 is determined using Equation 1. The master battery management apparatus identifies a battery that has not been determined to be the target battery. For example, the master battery management apparatus references the target battery history to identify the battery that has not been determined to be the target battery. As shown in Table 5, battery_1 and battery_8 have not been determined to be the target battery during a predetermined time, for example, the history monitoring time corresponding to a period of time from zero to 7t. The master battery management apparatus re-determines state information of the identified battery (that has not been determined to be the target battery) based on physical quantity data of the identified battery. In Table 5, the master battery management apparatus re-determines state information of battery_1 and battery_8 based on corresponding physical quantity data of battery_1 and battery_8. Having not been determined to be the target battery, each of battery_1 and battery_8 has a pattern different from that represented in voltage data of another battery. Thus, when the state information is determined using Equation 1, the state information of each of battery_1 and battery_8 may be inaccurate. To increase accuracy on determining the state information of each of battery_1 and battery_8, the master battery management apparatus uses the physical quantity data of each of battery_1 and battery_8.

Also, before the state information of each of battery_1 and battery unit_8 is determined using Equation 1 in a period of time from 6t to 7t, the master battery management apparatus determines the state information of each of battery_1 and battery_8 based on the physical quantity data of each of battery_1 and battery_8. In this example, a calculation of Equation 1 is not performed on battery_1 and battery_8 and, as a result, an amount of operation is reduced.

The master battery management apparatus determines the state information of each of the batteries during a subsequent period of time. During the subsequent period of time, the master battery management apparatus identifies a battery or one of the batteries that is not determined to be a target battery. For example, the master battery management apparatus identifies a battery that is not determined to be a target battery during a period of time from 8t to 14t. The master battery management apparatus determines state information of the identified battery using physical quantity data of the identified battery unit in lieu of using Equation 1.

In response to the state information of each of the batteries being determined, the master battery management apparatus determines pack state information including the batteries. The pack state information is an average value of the determined state information or a minimal value of the determined state information. The master battery management apparatus transmits the pack state information to a user terminal through a communication interface.

As described above, the example of FIG. 2 may be alternatively implemented at the slave battery management apparatus. In such example, the slave battery management apparatus collects the physical quantity data of each of the batteries. The slave battery management apparatus calculates the change information of each of the batteries, and determines the target batteries based on the calculated change information. The slave battery management apparatus determines the state information of each of the target batteries. The slave battery management apparatus calculates the difference information between the electrical physical quantity data of each of the target batteries and the electrical physical quantity data of the remaining battery. The slave battery management apparatus determines the corresponding target battery of the remaining battery among the target batteries, and determines the state information of the remaining battery. The slave battery management apparatus transmits the items of state information to the master battery management apparatus.

The master battery management apparatus receives the items of state information from at least one slave battery management apparatus. The master battery management apparatus determines pack state information of a battery pack including the batteries based on the items of state information. In one embodiment, the pack state information is an average value of the items of state information or a minimal value of the items of state information. The master battery management apparatus transmits the pack state information to a user terminal through a communication interface.

Figure 5:
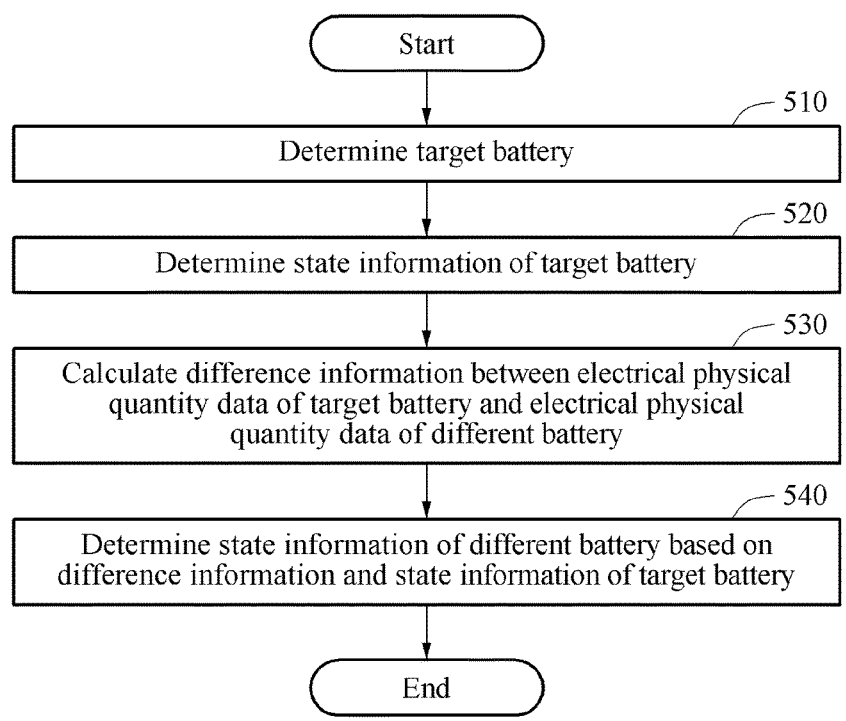
FIG. 5 illustrates an example of a battery management method.

FIG. 5 illustrates an example of a battery management method.

A battery management method of FIG. 5 is performed by a battery management apparatus. The battery management apparatus is, for example, a master battery management apparatus or a slave battery management apparatus.

Referring to FIG. 5, in operation 510, the battery management apparatus determines a target battery among batteries. For example, the battery management apparatus calculates change information of each of the batteries based on a difference between electrical physical quantity data of each of the batteries and approximate data corresponding to the electrical physical quantity data of each of the batteries. The battery management apparatus determines the target battery based on the change information.

In operation 520, the battery management apparatus determines state information of the target battery based on physical quantity data of the target battery.

In operation 530, the battery management apparatus calculates difference information between electrical physical quantity data of the target battery and electrical physical quantity data of a battery, different from the target battery among the batteries.

In operation 540, the battery management apparatus determines state information of the different battery based on the difference information and the state information of the target battery.

As a result, the battery management apparatus quickly and effectively determines the state information of the different battery using a small amount of time than ordinarily used to determine the state information of the different battery based on the physical quantity data of the different battery. In this example, an amount of time used to determine state information of each of the batteries is reduced. Also, a data throughput required to calculate the state information of each of the batteries is reduced.

Because the descriptions of FIGS. 1 through 4 are also applicable here, repeated descriptions of FIG. 5 are omitted for brevity.

Figure 6:
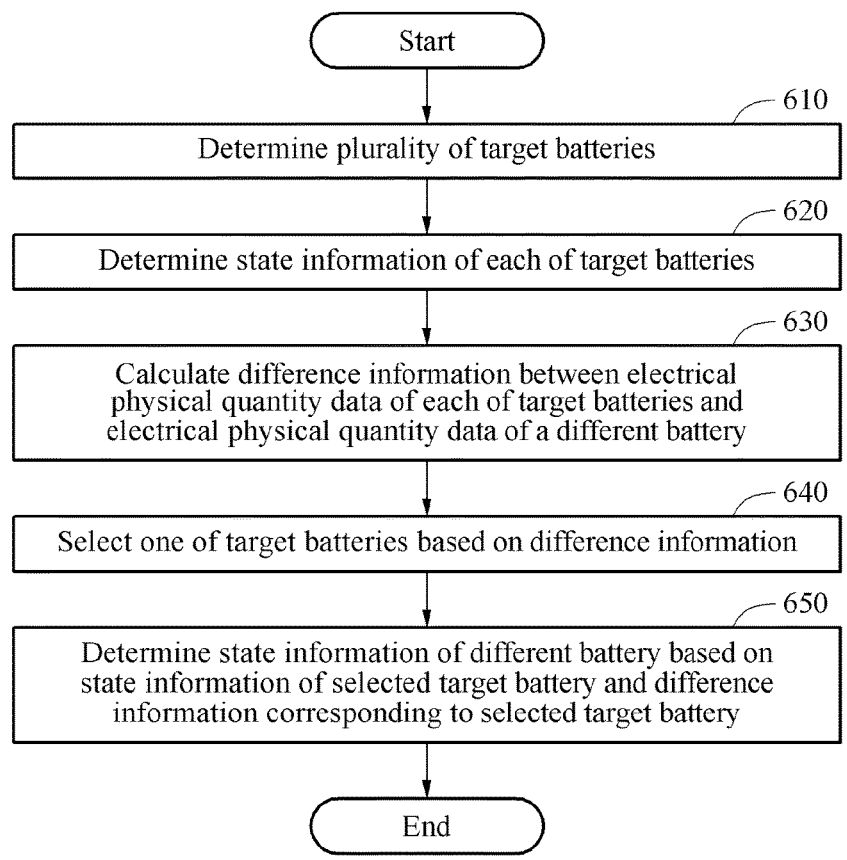
FIG. 6 illustrates another example of a battery management method.

FIG. 6 illustrates another example of a battery management method.

A battery management method of FIG. 6 is performed by a battery management apparatus. The battery management apparatus is, for example, a master battery management apparatus or a slave battery management apparatus.

Referring to FIG. 6, in operation 610, the battery management apparatus determines the plurality of target battery units among batteries.

In operation 620, the battery management apparatus determines state information of each of the target batteries.

In operation 630, the battery management apparatus calculates difference information between electrical physical quantity data of each of the target batteries and electrical physical quantity data of a battery different from the target batteries among the batteries.

In operation 640, the battery management apparatus selects a target battery from the target batteries based on the difference information. A similarity between electrical physical quantity data of the selected target battery and the electrical physical quantity data of the different battery is higher than a similarity between the electrical physical quantity data of the different battery and electrical physical quantity data of another target battery.

In operation 650, the battery management apparatus determines state information of the different battery based on difference information corresponding to the selected target battery and state information of the selected target battery. The difference information corresponding to the selected target battery is, for example, difference information between electrical physical quantity data of the selected target battery and the electrical physical quantity data of the different battery.

Because the descriptions of FIGS. 1 through 5 are also applicable here, repeated descriptions of FIG. 6 are omitted for brevity.

Figure 7:
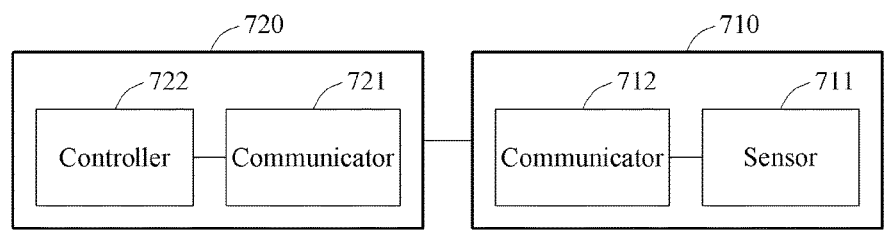
FIG. 7 illustrates an example of a master battery management apparatus and a slave battery management apparatus.

FIG. 7 illustrates an example of a master battery management apparatus and a slave battery management apparatus.

Referring to FIG. 7, a slave battery management apparatus 710 includes the sensor 711 and the communicator 712.

The sensor 711 includes, for example, any one or any combination of any two or more of a voltage sensor, a current sensor, and a temperature sensor. The sensor 711 senses a physical quantity of each of batteries. In an embodiment, a battery is a battery cell or a battery module. The physical quantity includes, for example, a voltage, a current, and/or a temperature. Physical quantity data is generated based on sensing of the sensor 711. For example, the slave battery management apparatus 710 collects physical quantity data of a battery using at least one sensor.

The communicator 712 transmits the physical quantity data to a master battery management apparatus 720.

The master battery management apparatus 720 includes a communicator 721 and a controller 722.

The communicator 721 receives the physical quantity data of each of the batteries from the slave battery management apparatus 710.

The controller 722 performs the battery management method described with reference to FIG. 2, FIG. 5, or FIG. 6. The controller 722 determines a target battery among the batteries. For example, the controller 722 calculates change information of each of the batteries, and determines a battery corresponding to average change information to be the target battery. Also, the controller 722 determines target batteries. For example, the controller 722 determines batteries that correspond to maximal change information, average change information, and minimal change information to be the target batteries.

The controller 722 determines state information of the target battery based on physical quantity data of the target battery.

The controller 722 determines state information of a battery different from the target battery of the batteries based on the state information of the target battery and difference information between electrical physical quantity data of the different battery and electrical physical quantity data of the target battery. The controller 722 determines state information of each of the batteries included in a battery pack.

The controller 722 determines pack state information of the battery pack. The pack state information is an average value of the state information of the batteries or a minimal value of the state information of the batteries.

Although not shown in FIG. 7, the master battery management apparatus 720 also includes a memory. The memory stores instructions associated with an operation of the controller 722 in accord with FIG. 2, FIG. 5, or FIG. 6. The controller 722 performs the aforementioned battery management method based on an execution of the instructions.

The communicator 712, the controller 722, and/or the memory may be implemented as one or more processors, for example, a micro control unit (MCU).

Because the descriptions of FIGS. 1 through 6 are also applicable here, repeated descriptions of FIG. 7 are omitted for brevity.

Figure 8:
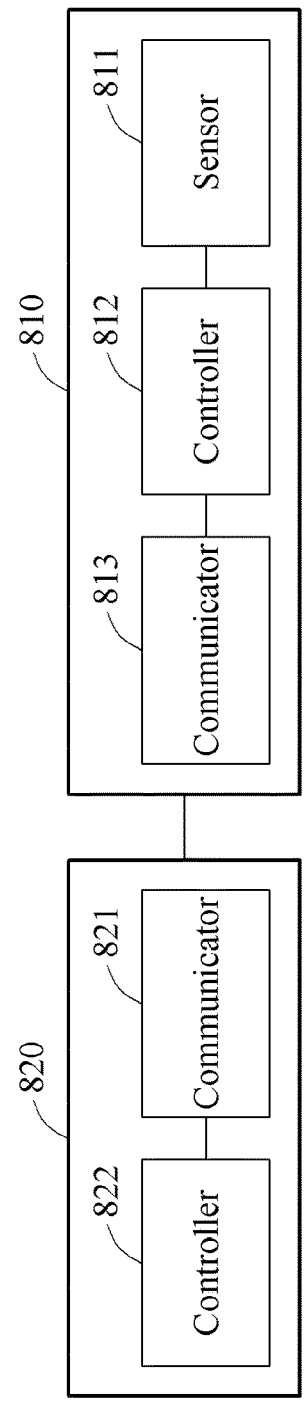
FIG. 8 illustrates another example of a master battery management apparatus and a slave battery management apparatus.

FIG. 8 illustrates another example of a master battery management apparatus and a slave battery management apparatus.

Referring to FIG. 8, a slave battery management apparatus 810 includes a sensor 811, a controller 812, and a communicator 813.

The sensor 811 senses a physical quantity of a battery and generates physical quantity data of the battery.

The controller 812 performs the battery management method described with reference to FIG. 2, FIG. 5, or FIG. 6. The controller 812 determines at least one target battery among batteries, determines state information of the target battery, and determines state information of remaining batteries among the batteries, different from the target battery.

The communicator 813 transmits state information of each of the batteries to the master battery management apparatus 820.

The sensor 811, the controller 812, and/or the communicator 813 are implemented as one or more processors, for example, an MCU.

A master battery management apparatus 820 includes a communicator 821 and a controller 822.

The communicator 821 receives items of state information from the slave battery management apparatus 810.

The controller 822 determines pack state information of a battery pack including the batteries. The pack state information is an average value of the items of state information or a minimal value of the items of state information.

Also, the controller 812 of the slave battery management apparatus 810 performs a portion of operations of the battery management method described with reference to FIG. 2, FIG. 5, or FIG. 6, and the controller 822 of the master battery management apparatus 820 performs a remaining portion of operations thereof. For example, the controller 812 performs operation 210 or operations 210 and 220 of FIG. 2, and the controller 822 performs the remaining operations of FIG. 2. Through this, a data throughput and/or a computational burden may be distributed.

Because the descriptions of FIGS. 1 through 7 are also applicable here, repeated descriptions of FIG. 8 are omitted for brevity.

Figure 9:
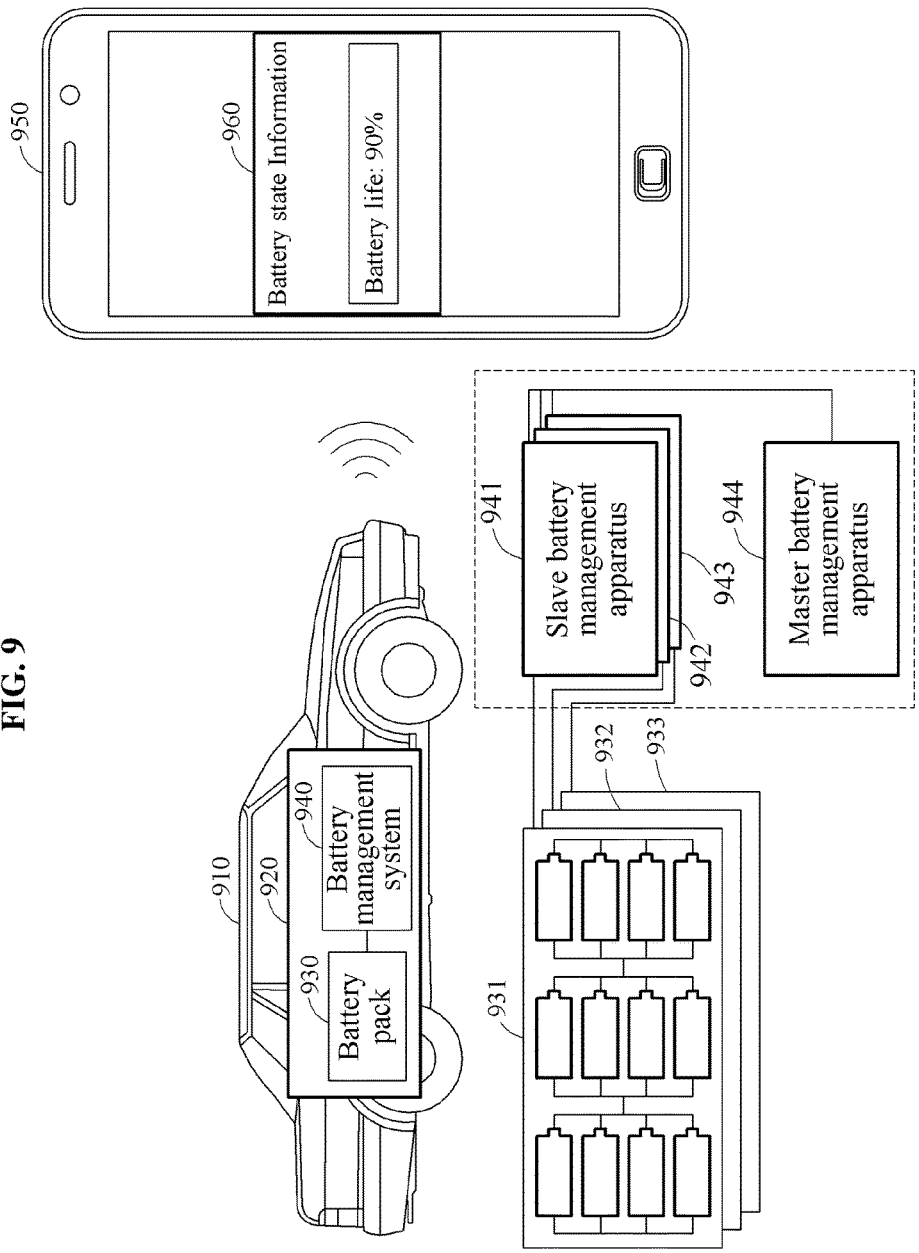
FIG. 9 illustrates an example of providing battery state information.

FIG. 9 illustrates an example of providing battery state information.

FIG. 9 illustrates a physical application 910. For example, the physical application 910 is an automobile or other vehicle, such as an electric vehicle or a hybrid vehicle.

The physical application 910 includes a battery system 920. The aforementioned physical application is merely an example and; thus, a type of the structural application 910 is not limited to the example.

The battery system 920 includes a battery pack 930 and a battery management system 940.

The battery pack 930 includes battery modules 931, 932, and 933. Each of the battery modules 931, 932, and 933 includes battery cells.

The battery management system 940 performs the battery management method of FIG. 2, 5, or 6. For example, the battery management system 940 determines a target cell and determines state information of the target cell. Also, the battery management system 940 determines state information of another battery cell based on the state information of the target cell. The battery management system 940 also determines difference information between electrical physical quantity data of the target cell and electrical physical quantity data of the other battery cell. As a result, the battery management system 940 determines state information of each of the plurality of battery cells in the battery pack 930. Hereinafter, an operation of the battery management system 940 will be described.

As illustrated in FIG. 9, the battery management system 940 includes slave battery management apparatuses 941, 942, and 943, and a master battery management apparatus 944.

The slave battery management apparatus 941 monitors the battery module 931. The slave battery management apparatus 941 collects physical quantity data of each of the battery cells in the battery module 931. Also, the slave battery management apparatus 941 transmits the collected the physical quantity data to the master battery management apparatus 944. Similarly, the slave battery management apparatus 942 transmits physical quantity data of each of the battery cells in the battery module 932 to the master battery management apparatus 944, and the slave battery management apparatus 943 transmits physical quantity data of each of the battery cells in the battery module 933 to the master battery management apparatus 944.

The master battery management apparatus 944 receives the physical quantity data of each of the battery cells in the battery pack 930. The master battery management apparatus 944 performs the battery management method of FIG. 2, 5, or 6. The master battery management apparatus 944 determines cell state information of each of the battery cells in the battery pack 930. The master battery management apparatus 944 determines pack state information of the battery pack 930 based on the determined cell state information. The pack state information is, but not limited to, an average value of the determined cell state information or a minimal value of the determined cell state information.

Depending on examples, each of the slave battery management apparatuses 941, 942, and 943 determines state information of each battery cell in a corresponding battery module. For example, the slave battery management apparatus 941 determines a target cell among battery cells in the battery module 931, and determines cell state information of the target cell. Also, the slave battery management apparatus 941 calculates difference information between electrical physical quantity data of the target cell and electrical physical quantity data of a battery cell, different from the target cell in the battery module 931. The slave battery management apparatus 941 determines cell state information of the different battery cell based on the calculated difference information and the cell state information of the target cell. Further, each of the slave battery management apparatuses 942 and 943 determines cell state information of each battery cell in a corresponding battery module.

Each of the slave battery management apparatuses 941, 942, and 943 transmits the determined cell state information to the master battery management apparatus 944. The master battery management apparatus 944 determines pack state information based on the cell state information received from the slave battery management apparatuses 941, 942, and 943.

Also, module state information of each of the plurality of battery modules 931, 932, and 933 is determined. The master battery management apparatus 944 or the slave battery management apparatus 941 determines the cell state information of the battery cells in the battery module 931, and the average value of the determined cell state information or the minimal value of the determined cell state information to be the module state information of the battery module 931. Module state information of each of the battery modules 932 and 933 is also determined through a similar operation.

Through a communication interface, the battery management system 940 transmits at least one of the pack state information, the module state information, or the cell state information to a terminal 950. The terminal 950 displays received state information 960 on a display.

In one example, each of the slave battery management apparatuses 941, 942, and 943 and/or the master battery management apparatus 944 may be implemented in a form of a microchip. In this example, each of the slave battery management apparatuses 941, 942, and 943 is located internally or externally to the corresponding battery module. The battery management system 940 is included in a high-capacity battery management system, such as an energy storage system (ESS). The battery management system 940 is also included in a device management system or an electric device including a rechargeable battery.

Because the descriptions of FIGS. 1 through 8 are also applicable here, repeated descriptions of FIG. 9 are omitted for brevity.

Figure 10:
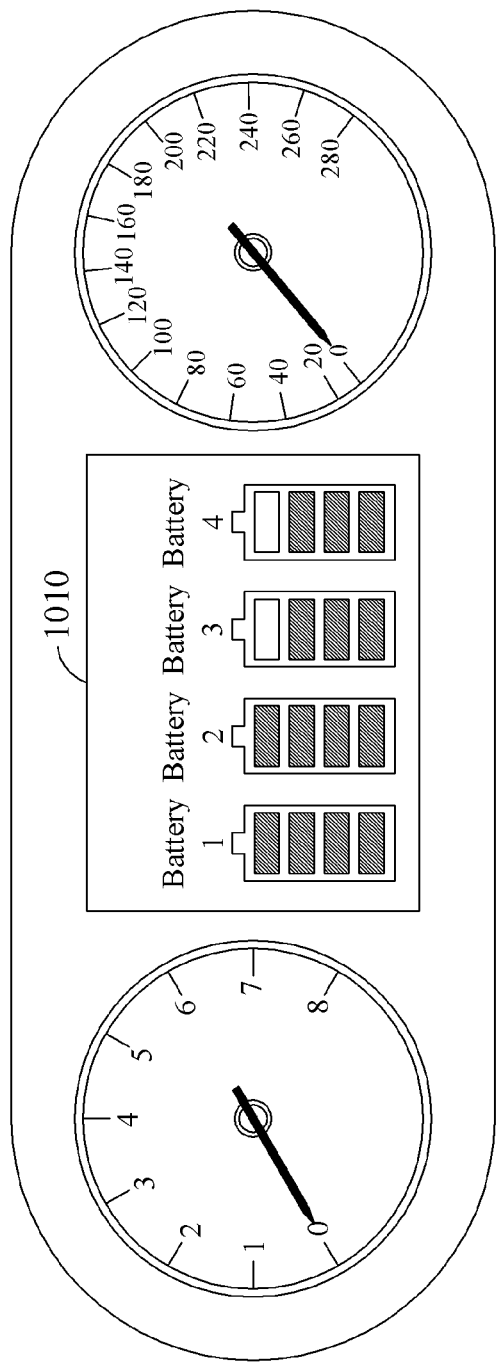
FIG. 10 illustrates another example of providing battery state information.

FIG. 10 illustrates another example of providing battery state information.

Referring to FIG. 10, state information 1010 of each of batteries is displayed on a dashboard. In an example, a battery is a battery cell or a battery module. Although not shown in FIG. 10, pack state information is also displayed on the dashboard.

A battery management system transmits cell state information, module state information, or the pack state information to an electronic control unit (ECU). The ECU displays the cell state information, the module state information, and the pack state information on the dashboard.

Because the descriptions of FIGS. 1 through 9 are also applicable here, repeated descriptions of FIG. 10 are omitted for brevity.

The apparatuses, communicator, sensor, and battery packs in FIGS. 1, and 7-9 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2, 5, and 6 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method to manage a battery, comprising:
   determining state information of a target battery, from among a plurality of batteries, according to a first scheme, wherein the first scheme comprises determining the state information of the target battery based on quantity data of the target battery; and
   determining state information of a non-target battery, different from the target battery, from among the plurality of batteries, according to a second scheme different from the first scheme, wherein the second scheme comprises determining the state information of the non-target battery based on the state information of the target battery and difference information between electrical quantity data of the non-target battery and the electrical quantity data of the target battery.

2. The method of claim 1, further comprising:
   calculating a difference, within each individual battery of the plurality of batteries, between electrical quantity data of the individual battery and approximate data corresponding to the electrical quantity data of the individual battery;
   calculating change information of each individual battery based on a value of the difference; and
   determining from the plurality of batteries at least one designated to serve as the target battery based on the change information.

3. The method of claim 2, wherein the at least one designated to serve as the target battery comprises any one or any combination of any two or more of a battery corresponding to maximal change information, a battery corresponding to average change information, or a battery corresponding to minimal change information.

4. The method of claim 2, wherein the calculating of the change information of each individual battery comprises:
   calculating difference values between items of electrical quantity data in a reference interval and approximate data of the items of electrical quantity data in the reference interval; and
   obtaining a sum of the calculated difference values for each individual battery.

5. The method of claim 1, further comprising:
   calculating, in response to a plurality of target batteries being determined, difference information between electrical quantity data of each of the target batteries and the electrical quantity data of the non-target battery; and
   identifying a corresponding target battery for association to the non-target battery among the plurality of target batteries based on the calculated difference information,
   wherein the determining of the state information of the non-target battery comprises:
   determining the state information of the non-target battery based on the difference information between electrical quantity data of the corresponding target battery and the electrical quantity data of the non-target battery.

6. The method of claim 5, wherein the corresponding target battery is a target battery comprising electrical quantity data most similar to the electrical quantity data of the non-target battery.

7. The method of claim 1, further comprising:
   selecting, in response to a plurality of target batteries being determined, a corresponding target battery corresponding to a minimal value of difference information between electrical quantity data of each of the plurality of target batteries and the electrical quantity data of the non-target battery,
   wherein the determining of the state information of the non-target battery comprises:
   determining a value, obtained by multiplying the minimal value by state information of the selected corresponding target battery, to be the state information of the non-target battery.

8. The method of claim 1, further comprising:
   calculating difference values between items of electrical quantity data in a reference interval of the non-target battery and items of electrical quantity data in the reference interval of the target battery and determining a sum of the calculated difference values to be the state information of the non-target battery.

9. The method of claim 1, further comprising:
   identifying a battery excluding the target battery during a period of time among the plurality of batteries; and
   determining state information of the identified battery based on quantity data of the identified battery.

10. The method of claim 9, wherein the determining of the state information of the identified battery comprises:
re-determining the state information of the identified battery based on the quantity data of the identified battery in response to the state information of the identified battery being determined based on difference information between electrical quantity data of a corresponding target battery of the identified battery and electrical quantity data of the identified battery and state information of the corresponding target battery, and
wherein the corresponding target battery is a target battery corresponding to electrical quantity data most similar to the electrical quantity data of the identified battery.

11. A method to manage a battery, comprising:
determining state information of each of target batteries among batteries according to a first scheme, wherein the first scheme comprises determining the state information for each of the target batteries based on quantity data of each of the target batteries;
calculating difference information between electrical quantity data of each of the target batteries and electrical quantity data of a battery, different from the target batteries, among the batteries;
selecting a target battery from the target batteries based on the difference information; and
determining state information of the different battery according to a second scheme different from the first scheme, wherein the second scheme comprises determining the state information of the different battery based on state information of the selected target battery and difference information between the electrical quantity data of the different battery and electrical quantity data of the selected target battery.

12. The method of claim 11, further comprising:
calculating a difference, within each individual battery, between electrical quantity data of the individual battery and approximate data corresponding to the electrical quantity data of the individual battery;
calculating change information of each individual battery based on the difference; and
determining the target batteries based on the change information.

13. The method of claim 11, wherein the calculating of the difference information comprises calculating difference values between items of electrical quantity data in a reference interval of the different battery and items of electrical quantity data in the reference interval of each of the target batteries and determining a sum of the calculated values to be the difference information.

14. The method of claim 11, wherein the selecting of the target battery comprises selecting a target battery for which minimal difference information is calculated, and
the determining of the state information of the different battery comprises determining a value obtained by multiplying the minimal difference information and the state information of the selected target battery to be the state information of the different battery.

15. A non-transitory computer-readable storage medium storing instructions that, when executed by a processor, cause the processor to perform the method of claim 1.

16. An apparatus to manage a battery, comprising:
a communicator configured to receive quantity data of each of a plurality of batteries; and
a controller configured to:
determine state information of a target battery determined among the batteries according to a first scheme, wherein the first scheme comprises determining the state information of the target battery based on physical quantity data of the target battery and
determine state information of a battery, different from the target battery among the batteries, according to a second scheme different from the first scheme, wherein the second scheme comprises determining the state information of the different battery based on the state information of the target battery and difference information between electrical quantity data of the different battery and electrical quantity data of the target battery.

17. The apparatus of claim 16, wherein the controller is configured to calculate a difference, within each individual battery, between electrical quantity data of the individual battery and approximate data corresponding to the electrical quantity data of the individual battery, calculate change information of each individual battery based on a value of the difference, and determine the target battery among the batteries based on the change information.

18. The apparatus of claim 17, wherein the target battery comprises any one or any combination of any two or more of a battery corresponding to maximal change information, a battery corresponding to average change information, or a battery corresponding to minimal change information.

19. The apparatus of claim 17, wherein the controller is configured to calculate difference values between items of electrical quantity data in a reference interval and approximate data of the items of electrical quantity data in the reference interval, and obtain a sum of the calculated difference values for each individual battery.

20. The apparatus of claim 16, wherein, in response to target batteries being determined, the controller is configured to calculate difference information between electrical quantity data of each of the target batteries and the electrical quantity data of the different battery, identify a corresponding target battery of the different battery among the target batteries based on the calculated difference information, and determine the state information of the different battery based on the difference information between electrical quantity data of the corresponding target battery and the electrical physical quantity data of the different battery.

21. The apparatus of claim 20, wherein the corresponding target battery is a target battery corresponding to electrical quantity data most similar to the electrical quantity data of the different battery.

22. The apparatus of claim 16, wherein, in response to target batteries being determined, the controller is configured to select a target battery corresponding to a minimal value of difference information between electrical quantity data of each of the target batteries and the electrical quantity data of the different battery, and determine a value, obtained by multiplying the minimal value by state information of the selected target battery, to be the state information of the different battery.

23. The apparatus of claim 16, wherein the controller is configured to calculate difference values between items of electrical quantity data in a reference interval of the different battery and items of electrical quantity data in the reference interval of the target battery, and determine a sum of the calculated values to be the difference information.

24. The apparatus of claim 16, wherein the controller is configured to identify a battery excluding the target battery during a period of time among the batteries, and determine state information of the identified battery based on physical quantity data of the identified battery.

25. The apparatus of claim 24, wherein the controller is configured to re-determine the state information of the identified battery based on the quantity data of the identified battery in response to the state information of the identified battery being determined based on difference information between electrical quantity data of a corresponding target battery of the identified battery and electrical quantity data of the identified battery and state information of the corresponding target battery,
- wherein the corresponding target battery is a target battery corresponding to electrical physical quantity data most similar to the electrical quantity data of the identified battery.

26. A battery management system, comprising:
- a slave battery management apparatus corresponding to a battery module comprising battery cells; and
- a master battery management apparatus configured to communicate with the slave battery management apparatus,
- wherein the battery management system is configured to:
- receive physical quantity data of each of the battery cells,
- determine state information of a target battery cell determined among the battery cells according to a first scheme, wherein the first scheme comprises determining the state information of the target battery based on physical quantity data of the determined target cell, and
- determine state information of a battery cell different from the target battery cell, among the battery cells, according to a second scheme different from the first scheme, wherein the second scheme comprises determining the state information of the different battery based on the state information of the target battery cell and difference information between electrical quantity data of the different battery cell and electrical quantity data of the target battery cell.

27. The battery management system of claim 26, wherein, in response to a plurality of target battery cells being determined, the battery management system is configured to calculate difference information between electrical quantity data of each of the target battery cells and the electrical quantity data of the different battery cell,
- identify a corresponding target battery cell of the different battery cell based on the calculated difference information, and
- determine the state information of the different battery cell based on state information of the corresponding target battery cell and difference information between electrical physical quantity data of the corresponding target battery cell and the electrical physical quantity data of the different battery cell.

28. The method of claim 1, wherein the difference information is an offset value determined in relation to the target battery.

29. The method of claim 11, wherein the difference information consists of a plurality of offset values, determined in relation to a corresponding each of the target batteries.

30. The method of claim 1, wherein the first scheme comprises modifying a value determined from the state information of the target battery according to the difference information between electrical quantity data of the non-target battery and the electrical quantity data of the target battery.

31. The method of claim 1, further comprising:
- wherein the target battery is determined based on change information of each of the plurality of batteries, the change information of each of the plurality of batteries being based on difference values between items of electrical quantity data of each of the plurality of batteries and approximate data of the items of the electrical quantity data.

* * * * *